(12) United States Patent
Watanabe et al.

(10) Patent No.: US 6,432,261 B2
(45) Date of Patent: Aug. 13, 2002

(54) PLASMA ETCHING SYSTEM

(75) Inventors: Kazuhito Watanabe, Tama; Hironari Shimizu, Tachikawa; Toshiaki Koguchi, Kunitachi; Nobuyuki Takahashi, Sagamihara, all of (JP)

(73) Assignee: Anelva Corporation, Tokyo (JP)

( * ) Notice: Subject to any disclaimer, the term of this patent is extended or adjusted under 35 U.S.C. 154(b) by 24 days.

(21) Appl. No.: 09/758,141

(22) Filed: Jan. 12, 2001

(30) Foreign Application Priority Data

Jan. 14, 2000 (JP) ........................................ 2000-006440

(51) Int. Cl.$^7$ .................................................. C23F 1/02
(52) U.S. Cl. ............................... 156/345.47; 156/345.49
(58) Field of Search ...................... 118/723 E, 723 ER, 118/723 MA, 723 R, 715, 723 I, 723 IR, 723 AN, 723 MW, 723 ME, 723 MR; 156/345; 315/111.41

(56) References Cited

U.S. PATENT DOCUMENTS 5,614,055 A * 3/1997 Fairbairn et al. ........... 156/345
6,244,211 B1 * 6/2001 Nishikawa et al. ... 118/723 AN
6,333,601 B1 * 12/2001 Wickramanayaka ... 315/111.41

FOREIGN PATENT DOCUMENTS

JP          2000-331995          * 11/2000

* cited by examiner

*Primary Examiner*—Gregory Mills
*Assistant Examiner*—Luz Alejandro
(74) *Attorney, Agent, or Firm*—Oliff & Berridge, PLC

(57) ABSTRACT

A substrate holder and an electrode are arranged facing each other in a vacuum chamber. The electrode is provided with a process gas introduction mechanism and a gas blowoff plate. A substrate is loaded on the substrate holder, the process gas is introduced, and electric power is supplied between the substrate holder and the electrode to generate plasma for etching the substrate surface. At the rear side of the gas blowoff plate in the vacuum chamber, a plurality of magnets is provided at concentric positions. The magnetic field strength resulting from the magnets on the surface of the substrate is made 0 Gauss. By using the magnets in this way and improving the magnets, it is possible to establish a better etching process for various materials to be etched.

4 Claims, 6 Drawing Sheets

PLASMA ETCHING SYSTEM

BACKGROUND OF THE INVENTION

1. Field of the Invention

The present invention relates to a plasma etching system, and more particularly, relates to a plasma etching system having magnets in an electrode facing a substrate holder so as to control the magnetic field strength in the space in front of the substrate and thereby enabling various types of substrates to be etched and improving the etch rate.

2. Description of the Related Art

First an example of a plasma etching system of the related art will be explained with reference to FIG. 6. The plasma etching system is provided with a vacuum chamber 100. At the center of the ceiling 101 of the vacuum chamber 100 a disk-shaped electrode 103 is arranged through a ring-shaped insulator 102. At the bottom 104 of the vacuum chamber 100 a substrate holder 106 is arranged on a ring-shaped insulator 105. The electrode 103 and the substrate holder 106 are placed facing each other in a parallel state. Each of the electrode 103 and the substrate holder 106 has a built-in known mechanism for controlling the temperature. Further, the electrode 103 and the substrate holder 106 are connected to power sources 107 and 108 respectively. Electric power for inducing the discharge is supplied between the electrode 103 and the substrate holder 106 by these power sources 107 and 108. An evacuation port 110 is provided at the surrounding side wall 109 of the vacuum chamber 100. The evacuation port 110 has connected to it an evacuating mechanism 112 through a pressure control valve 111. A cylindrical shield member 113 is arranged at the inside of the surrounding side wall 110 around the substrate holder 106. Plasma is produced in the space inside the shield member 113. In the space the plasma performs an etching process. The shield member 113 is formed with several holes 113a. The inside and the outside of the shield member 113 are connected through these holes. The shield member 113 prevents contamination of the inner surface of the vacuum chamber 100. The electrode 103 is provided with a gas introduction mechanism for introducing process gas. The gas inlet mechanism is comprised of a gas distribution plate 114 and a gas blowoff plate 115. The gas introduction mechanism is connected to a gas supply source (not shown) through a gas introduction pipe 116 from the side of the upper surface of the electrode 103. The gas blowoff plate 115 has a large number of gas blowoff holes 115a. The process gas is introduced in the space in front of the substrate holder 106 through these gas blowoff holes. The member 117 provided at the substrate holder 106 is a pushout rod for carrying the substrates 118.

In the above configuration, a substrate 118 carried by a not shown substrate carrying mechanism is loaded on the substrate holder 106. Process gas is introduced into the vacuum chamber 100 through the gas introduction pipe 116. The process gas passes through the gas distribution plate 115 and the gas blowoff plate 114 provided at the bottom side of the electrode 103 and is introduced into the vacuum chamber 100. On the other hand, the evacuating mechanism 112 evacuates the internal space 100A of the vacuum chamber 100 to create a required vacuum state. The internal pressure of the shield member 113 is controlled to a suitable pressure by the pressure control valve 111. The internal pressure of the shield member 113 is determined in accordance with the process. Next, the electric power is fed between the substrate holder 106 and the electrode 103 by the power sources 107 and 108 to cause a discharge in the space (space above substrate in internal space 100A) in front of the substrate 106 to generate plasma. This plasma is utilized for etching a material to be etched on the substrate 118. At this time, the process gas introduced into the inside region of the shield member 113 is equally blown off over the substrate 118 by the gas distribution plate 114 and the gas blowoff plate 115 provided in the vacuum at the electrode 103.

In the configuration of the plasma etching system of the related art, the factors causing changes in the etch rate or etching distribution of the etched material on the surface of the substrate 118 are mainly the internal pressure of the vacuum chamber, the process gas, the fed electric power, and other process conditions. Therefore, conversely, when changing these process conditions, it is possible to change the etch rate or etching distribution of the etched material. Even if the process conditions are changed so as to improve the etch rate or etching distribution by a large extent, in practice, it is difficult to set process conditions to achieve a major improvement. Further, by changing the hardware configuration of a plasma etching system (for example, expanding or reducing the discharge region by modification of the shape of the shield member, or modification of the shape of the substrate holder), it is possible to control the etch rate or etching distribution of the etched material. In this case, however, it is necessary to remodel the system by a large extent in accordance with various processes. This becomes a large problem in terms of costs and the trouble in work.

SUMMARY OF THE INVENTION

An object of the present invention is to provide a plasma etching system which enables the establishment of a better etching process for various etched materials by just the use of magnets and further improvement of the magnets, enables various demands from end users to be met, and enables improvement of the speed of process development.

The plasma etching system according to the present invention is configured as follows to achieve the above object.

The plasma etching system according to the present invention has as a basic configuration a vacuum chamber functioning as a plasma etching chamber and a substrate holder and an electrode arranged facing each other in the inside of the vacuum chamber. A substrate is loaded on the substrate holder. The electrode has a mechanism for introducing a process gas and a gas blowoff plate. The inside of the vacuum chamber is evacuated by an evacuating mechanism and held at a predetermined reduced pressure state or vacuum state. In the state with the substrate loaded on the substrate holder, process gas is introduced inside the vacuum chamber and power is fed between the substrate holder and the electrode to generate plasma. This plasma etches the surface of the substrate. In this configuration, further, a plurality of ring-shaped magnets are arranged at concentric positions at the inside of the vacuum chamber at the rear side of the gas blowoff plate arranged at the electrode. These magnets are arranged so that the poles at the inside surfaces alternate in polarity. The magnetic field strength resulting from the plurality of magnets on the surface of the substrate is made substantially 0 Gauss.

According to the above plasma etching system, the plasma is controlled by providing magnets serving also as a gas distribution plate right behind (or right in front of) the gas blowoff plate so as to create a required distribution of magnetic field and magnetic field strength at the region where the plasma is produced. Due to this, it becomes possible to improve the distribution of the etched material on the substrate and improve the etch rate. By making the magnetic field strength near the surface of the substrate substantially 0, the damage to the substrate is reduced.

In the above configuration, preferably, the magnetic field strength resulting from the plurality of magnets at a plane positioned substantially at the center of the substrate holder and the electrode is made a uniform one of about 100 Gauss. By setting the distribution of the magnetic field resulting from the magnets to the value of the magnetic field strength explained above at the above center position, the above effects are effectively manifested.

In the plasma etching system having the above configuration, preferably, the magnetic field strength resulting from the plurality of magnets at the plane positioned substantially at the center of the substrate holder and the electrode is made a uniform one of about 200 Gauss. A similar effect can be exhibited even if setting the value of the magnetic field strength at the above center position at the above value.

In the plasma etching system having the above configuration, preferably, a plurality of magnets are fixed to a gas distribution plate and gas introduction holes are formed in the gas distribution plate corresponding to the intervals between the two included in the plurality of magnets. The gas distribution plate has a plurality of gas introduction holes for introducing into the vacuum chamber a process gas creating the etching gas. These gas introduction holes are formed using the locations corresponding to the spaces between the plurality of magnets since the plurality of ring-shaped magnets are fixed to the gas distribution plate arranged concentrically. Due to the actions of the plurality of ring-shaped magnets arranged in the concentric positional relationship and the gas distribution plate, a gas distribution function causing distribution of the introduced gas is realized.

In the plasma etching system according to the present invention, since a plurality of ring-shaped magnets are provided concentrically in a predetermined positional relationship at a position right behind the gas blowoff plate positioned above the substrate holder, the magnets are arranged so that their inside polar surfaces become alternately S and N, and the magnets are set so as to enable the magnetic field strength at the plane near the substrate surface and the magnetic field strength at a plane at the above center position to be set to predetermined values, the etch rate and etching distribution of the etched material can be greatly improved and the damage to the substrate can be minimized. Further, since the spread of the discharge is suppressed, the power can be concentrated and high efficiency and energy savings can be realized.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Hereinafter, preferred embodiments of the present invention will be explained with reference to the attached drawings.

Figure 1:
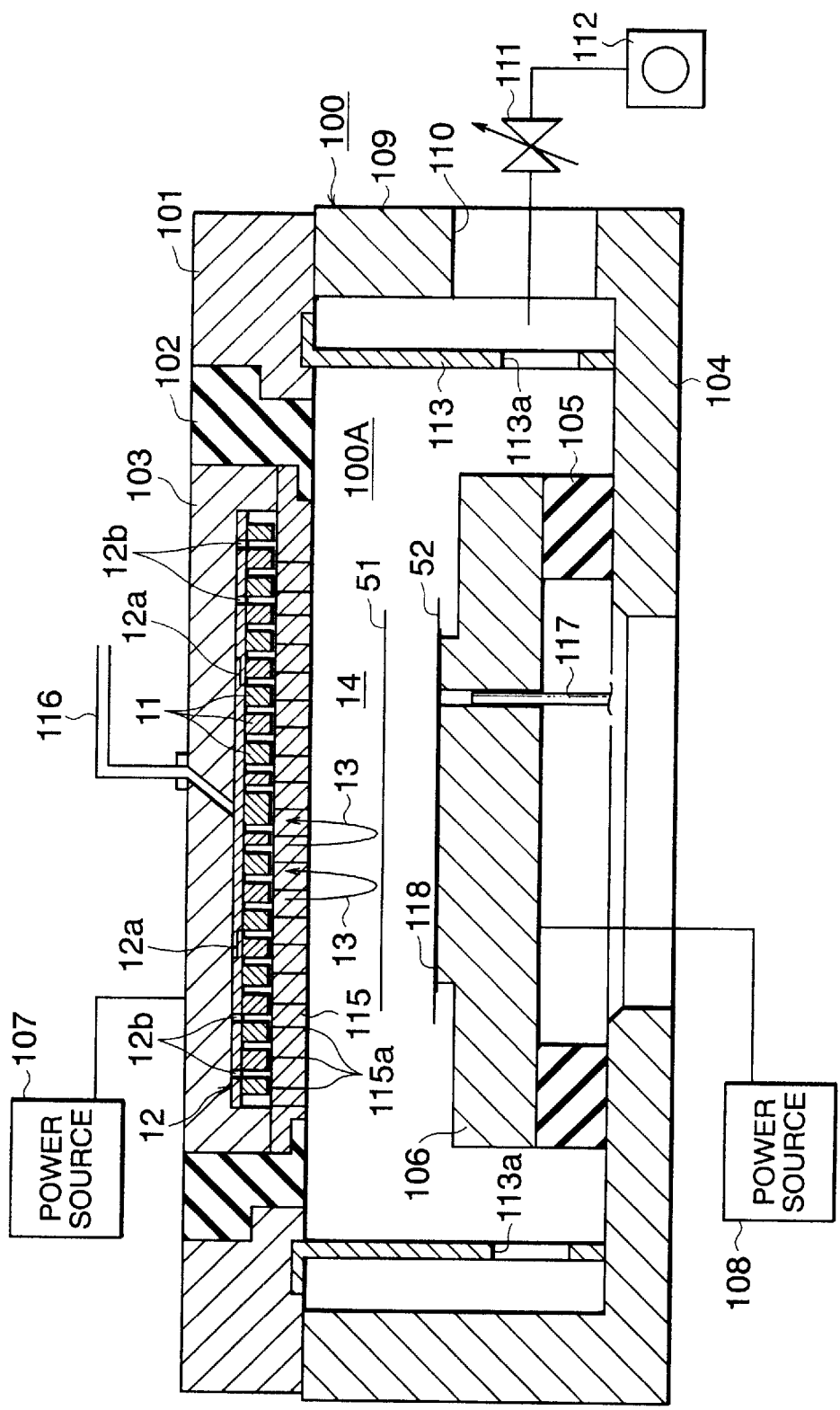
FIG. 1 is a longitudinal sectional view of the schematic basic configuration of a plasma etching system according to the present invention.

A representative embodiment of the plasma etching system according to the present invention will be explained with reference to FIG. 1 to FIG. 5. In FIG. 1, elements substantially the same as elements explained relating to the related art are assigned identical reference numerals.

Figure 2:
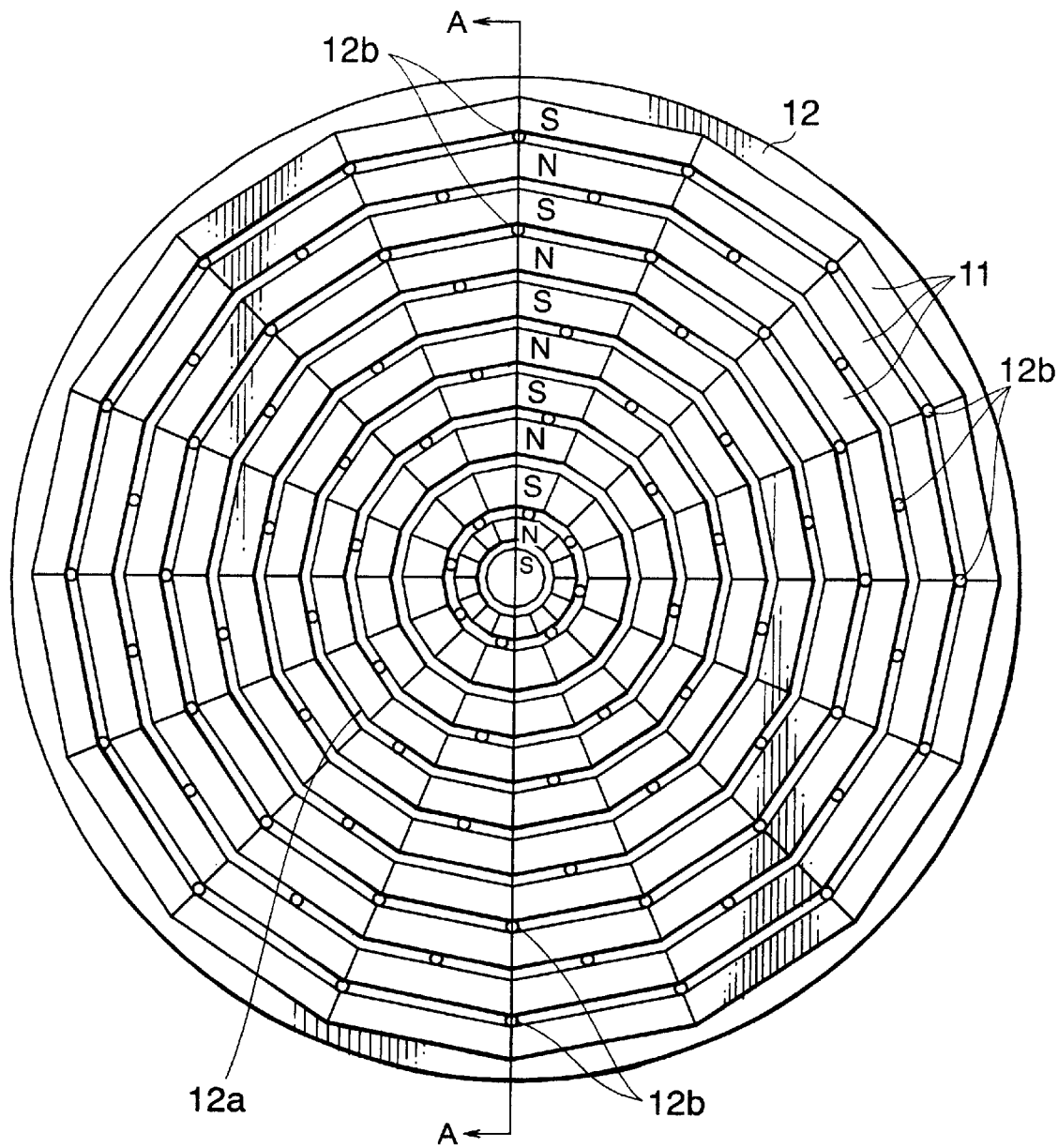
FIG. 2 is a view of the gas distribution plate with magnets fixed thereto as seen from below.
Figure 3:
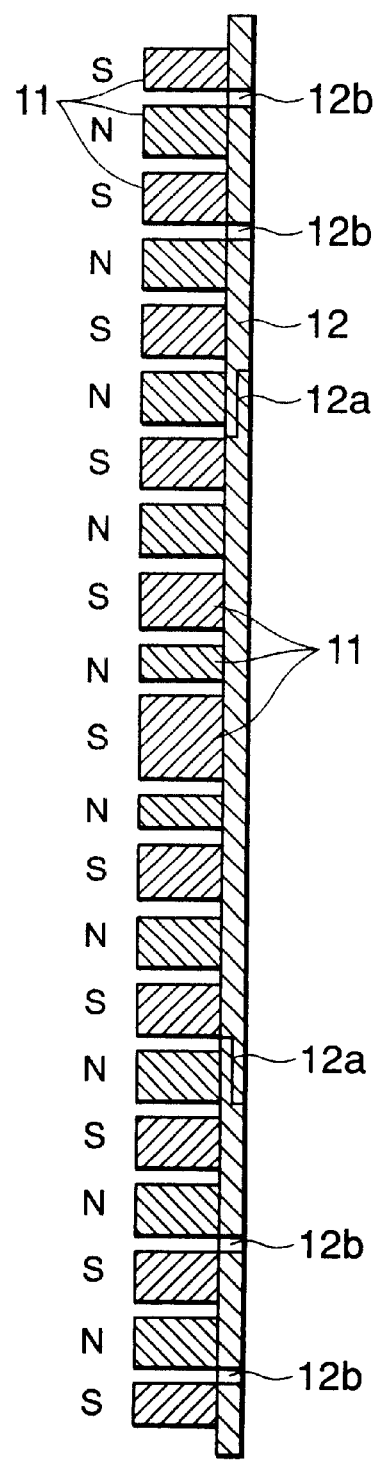
FIG. 3 is a sectional view along the line A—A in FIG. 2.

The configuration of the plasma etching system shown in FIG. 1 to FIG. 3 will be explained in brief first. FIG. 1 to FIG. 3 shows a configuration highlighting the characteristic parts of the present invention. The plasma etching system is provided with a vacuum chamber 100, a disk-shaped electrode 103 arranged at the center of a ceiling 101 of the vacuum chamber 100 through a ring-shaped insulator 102, and a substrate holder 106 arranged at a bottom 104 of the vacuum chamber 100 through a ring-shaped insulator 105. The electrode 103 and the substrate holder 106 are arranged facing each other in a parallel state. Each of them has a well-known mechanism for controlling the temperature (not shown). Further, the electrode 103 and the substrate holder 106 are respectively connected to power sources 107 and 108. Electric power for inducing the discharge is supplied into the region between the electrode 103 and the substrate holder 106 by these power sources. The electrode 103 and the substrate holder 106 function as a facing electrode system. An evacuation port 110 is provided at the surrounding side wall 109 of the vacuum chamber 100. The evacuation port 110 has connected to it an evacuating mechanism 112 through a pressure control valve 111. At the inside of the surrounding side wall 110 around the substrate holder 106 is arranged a cylindrical shield member 113. Plasma is produced in the space 100A inside the shield member 113 for an etching process. The shield member 113 has holes 113a which connect the inside and the outside of the shield member. The shield member 113 prevents contamination of the inner surface of the vacuum chamber 100. The electrode 103 is provided with a gas introduction mechanism for introducing a process gas. The gas introduction mechanism is comprised of a gas shower head 115. The gas inlet mechanism is connected to a gas supply source (not shown) through a gas introduction pipe 116 from the side of the upper surface of the electrode 103. The gas blowoff plate 115 has a large number of gas blowoff holes 115a. The process gas is introduced in the space in front of the substrate holder 106 through these gas blowoff holes. A pushout rod 117 for pushing out the substrate, which is used when loading the substrate 118, is provided at the substrate holder 106.

This plasma etching system has the following characteristic structure. The gas introduction mechanism is provided with a plurality of ring-shaped magnets 11 to be arranged concentrically in the vacuum region right behind the gas blowoff plate 115 (in the location near the rear side of the gas blowoff plate 115). The center magnet 11 is however cylindrical in shape. The plurality of magnets 11 are arranged so that their N and S poles alternate at the polar surfaces facing the bottom (or inside) in FIG. 1. In this example, the lower magnetic polar surface of the cylindrical magnet 11 positioned at the center is for example the S pole, the lower magnetic polar surface of the ring-shaped magnet 11 positioned at the outside of the center magnet is the N pole. Further, the magnetic polar surfaces of the ring-shaped magnets 11 outward from there are alternately changed to be the S pole, N pole, S pole and so on.

The plurality of magnets 11 are fixed to a gas distribution plate 12 positioned above them. The gas distribution plate 12 is attached to the bottom surface of the electrode 103 (the follow of the electrode 103) in a state maintaining a constant distance from the electrode 103. The gas distribution plate 12 is of a form which can be divided into two positioned at the center and the periphery for example. Reference numeral 12a shows the dividing line. In the gas distribution plate 12, a large number of gas introduction holes 12b are formed at locations corresponding to the intervals between the concentrically positioned magnets 11. The gas distribution plate 12 provided with the magnets 11 also functions as an overall gas distribution plate together with the magnets. As explained above, the magnet 11 positioned at the center is not ring-shaped, but a cylindrical block shape. However, it may also be a small diameter ring shape. Further, the plurality of ring-shaped magnets 11 arranged concentrically are preferably equal in width in the diametrical direction and arranged so that the intervals between the adjoining two of the magnets 11 are equal. The dimensions, however, are not limited to this. It is possible to set any dimensions in accordance with the conditions of the system. Further, as shown in FIG. 2, the ring-shaped magnets 11 have a split structure in the circumferential direction.

That is, the ring-shaped magnets 11 are prepared by arranging substantially box-shaped magnet segments in the circumferential direction. Therefore, the ring-shaped magnets 11 shown in FIG. 2 have polygonal shapes.

In FIG. 3, the polarities of the magnetic poles (inside magnetic polar surfaces) facing the inside of the vacuum chamber in the concentrically arranged ring-shaped magnets 11 are shown to be opposite between adjoining magnets. In FIG. 3, the gas distribution plate 12 is arranged at the right side.

The left side direction is the inside of the vacuum chamber 100. The magnets 11 are arranged so that the N poles and S poles alternate at the left side magnetic polar surfaces. In the illustrated example, the magnets are arranged so that the center one becomes the N pole, the ring-shaped magnet adjoining it at the outside becomes the S pole, and the ones outward from there alternately become the N, S, N . . . poles. In FIG. 1 and FIG. 3, magnets drawn in section by the first hatching (rightward rising hatching) mean magnets with inside polar surfaces of the S pole, while magnets drawn in section by the second hatching (rightward falling hatching) mean magnets with inside polar surfaces of the N pole. The directions of the hatching in the sectional illustrations of the magnets differ between the S poles and N poles. According to this arrangement of the magnets, as shown in FIG. 1, magnetic field lines 13 are produced to be closed from a magnet having an N polar surface to the magnets having S polar surfaces at both sides (or one side) thereof. In the space between the electrode 103 and the substrate holder 106 (space in front of substrate 118) where the magnetic field as shown by the magnetic field lines 13 is formed, by suitably setting the form of the magnets 11 and their magnetic line force distribution, it is becomes possible to produce a desired magnetic field and is further possible to easily improve the magnetic field distribution or the shape of the magnetic field in the space near the surface of the substrate or the space in front of the substrate. The distribution of the magnetic field will be explained in detail with reference to FIG. 5 later.

Figure 4:
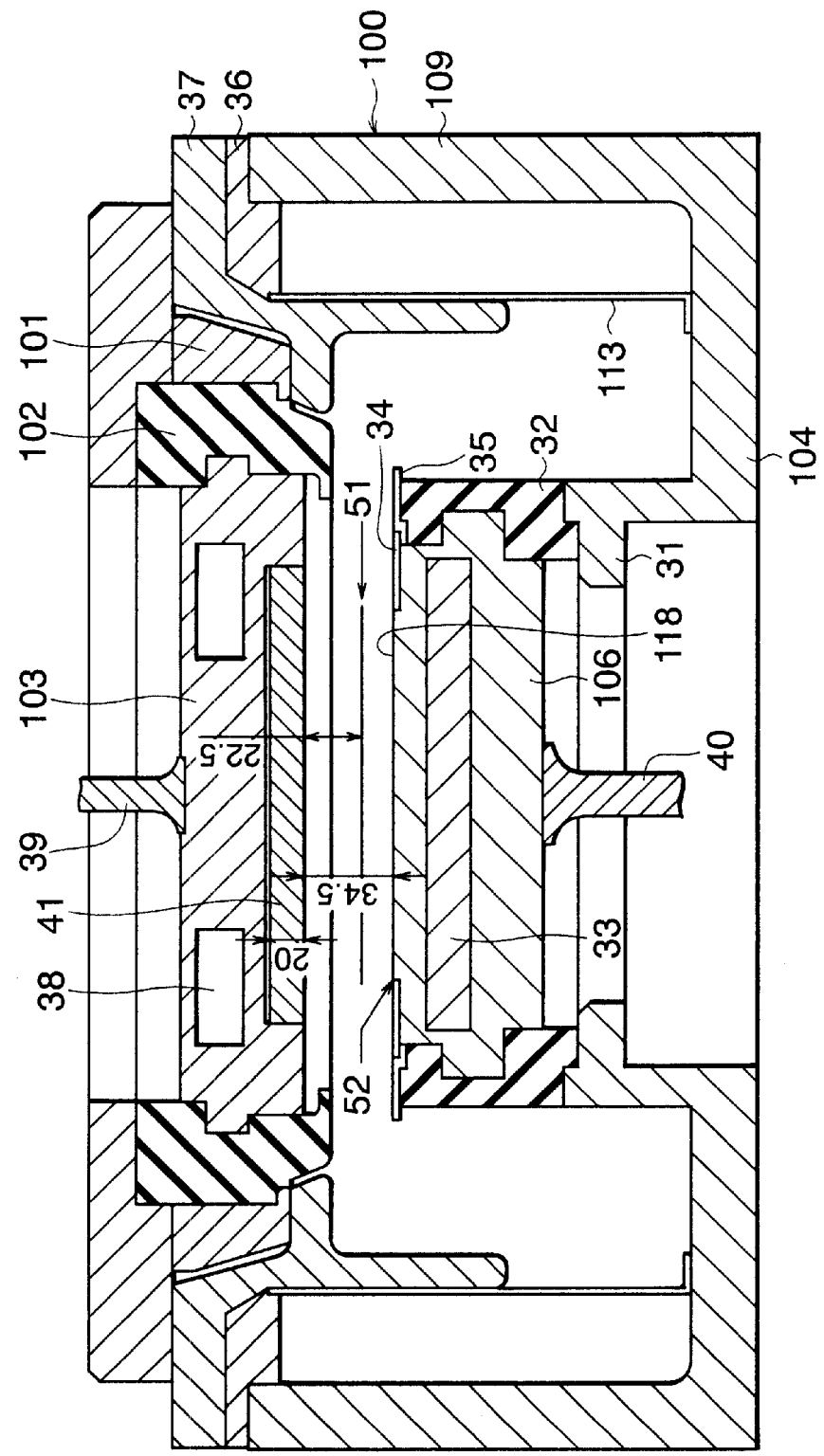
FIG. 4 is a view similar to FIG. 1 showing an example of the specific design of the plasma etching system according to the present invention.

FIG. 4 shows a specific example of the design of a plasma etching system according to the present invention having the above characteristic configuration. The basic configuration is the same as the configuration shown in FIG. 1. In FIG. 4, elements substantially the same as elements explained in FIG. 1 are assigned the same reference numerals. The vacuum chamber 100 is provided with a support 31 at the center of the bottom 104. The substrate holder 106 is arranged on the support 31 through an insulating support 32. The insulating support 32 corresponds to the above-mentioned ring-shaped insulator 105. A temperature control mechanism 33 is provided inside the substrate holder 106. A substrate 118 is loaded on the top surface of the substrate holder 106. At the outside circumference of the substrate 118, ring-shaped cover plates 34 and 35 are arranged. Above the substrate holder 106, at the ceiling 101 of the vacuum chamber 100, the electrode 103 is arranged through a ring-shaped insulator 102. Ring-shaped intermediate members 36 and 37 are arranged between the ceiling 101 and the surrounding wall 109 of the vacuum chamber 100. The electrode 103 is provided with a cooling passage 38 through which a refrigerant flows for cooling the electrode 103. Note that reference numeral 113 indicates the above-mentioned shield member, 39 a power conductor connected to the electrode 103, and 40 a power conductor connected to the substrate holder 106.

In the plasma etching system shown in FIG. 4, the above specific configurations such as the gas blowoff plate, magnets, and the gas distribution plate are not shown. A gas blowoff unit 41 includes magnets having the above configuration at the rear side of the gas blowoff plate.

Figure 5:
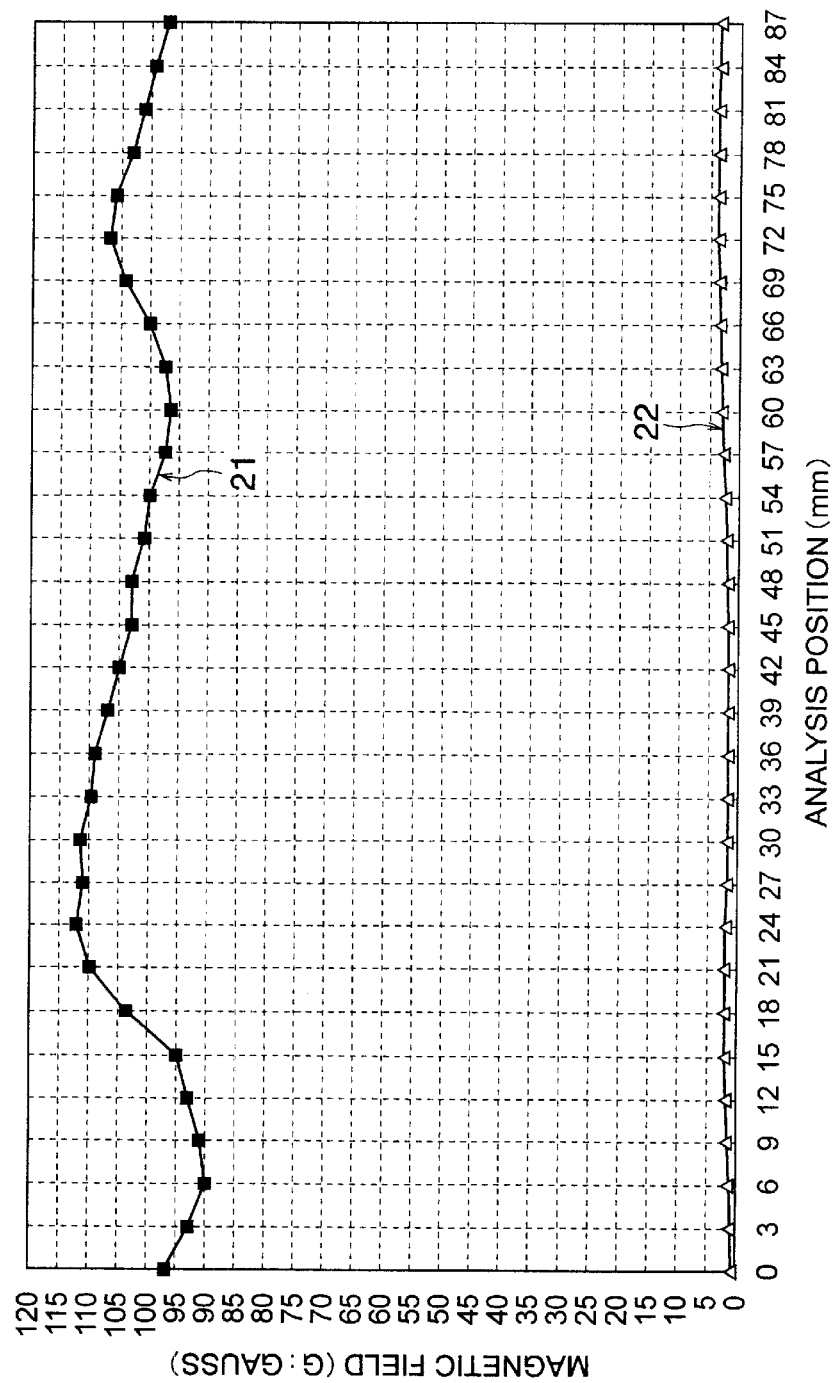
FIG. 5 is a view of the distribution of the magnetic field at a center position between the bottom surface of the gas blowoff plate and the substrate loaded surface of the substrate holder for a magnetic field created by the magnets, and the distribution of the magnetic field near the surface of the substrate loaded on the substrate holder.
Figure 6:
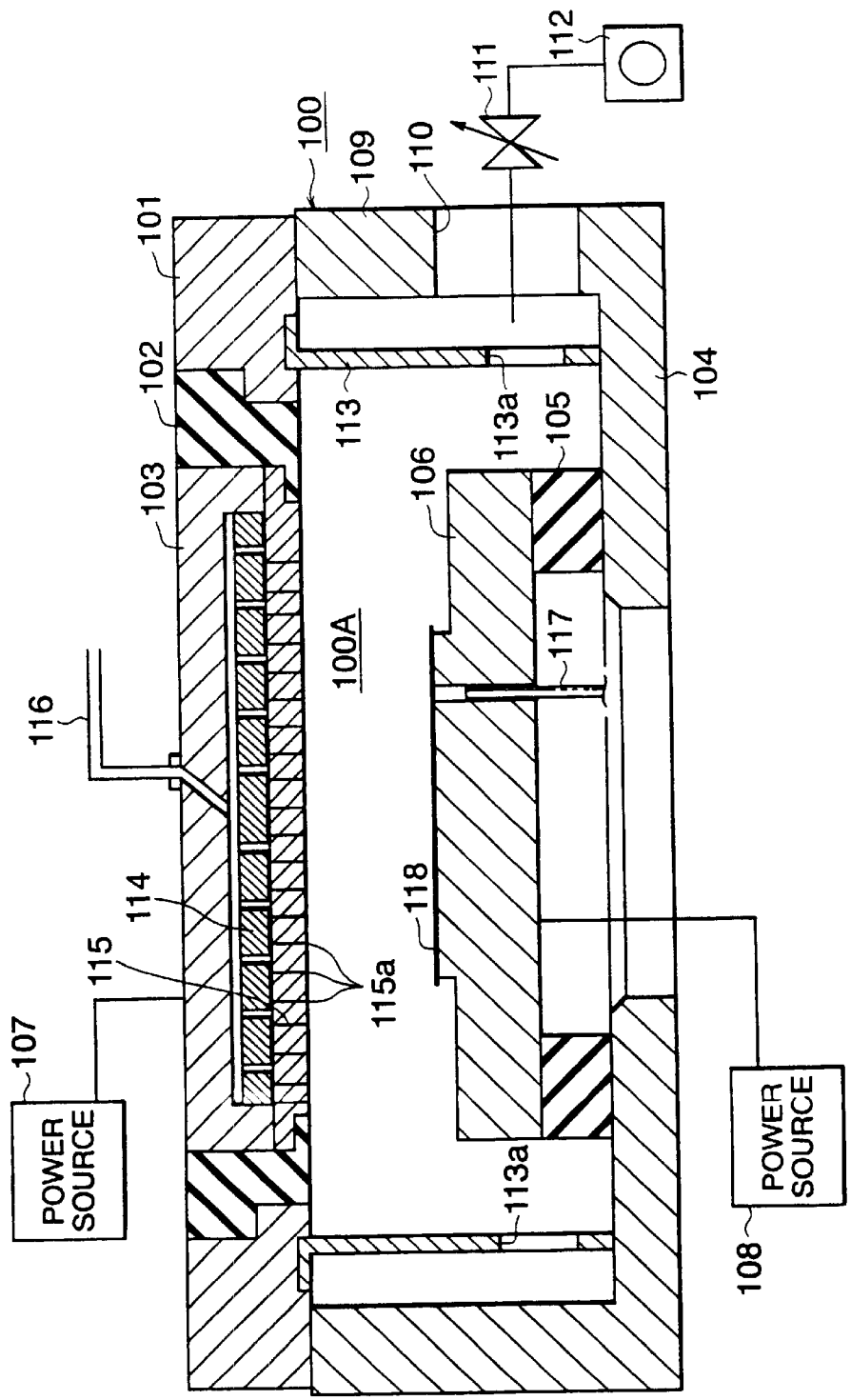
FIG. 6 is a longitudinal sectional view of the internal structure of a representative example of a plasma etching system of the related art.

Next, FIG. 5 shows a representative example of the magnetic field distribution (simulation based on experiments). The magnetic field distribution shown in FIG. 5 was obtained by the experiments based on the plasma etching system shown in FIG. 4. In the graph of FIG. 5, the abscissa indicates the analysis position (mm). The position of 0 on the left end corresponds to the center position of the substrate 118. The ordinate indicates the magnetic field strength (Gauss). The distribution curve 21 shows the magnetic field distribution at the location 5 positioned at the substantial center of the space between the electrode 103 and the substrate holder 106.

In this case, the distance between the electrode 103 and the substrate holder 106 is for example 22.5 mm as shown in FIG. 4. The distribution curve 22 shows the magnetic field distribution at the location 52 near the tip surface of the substrate 108.

In this case, the distance between the electrode 103 and the substrate holder 106 is for example 34.5 mm as shown in FIG. 4. As being clear from FIG. 5, the magnetic field strength is a substantially uniform 0 Gauss or so (specifically 0.8 Gauss as an average value obtained by the experiment) at a location near the top surface of the substrate 118, while the magnetic field strength at the location 51 positioned at the center is about 100 Gauss (specifically 102 Gauss as an average value obtained by the experiment). In both cases, the distributions can be said to be relatively uniform in the radial direction.

The etching operation of the plasma etching system having the above configuration will be explained next mainly referring to FIG. 1. The carried substrate 118 is loaded on the substrate holder 106 through the well-known substrate carrying mechanism and a gate valve (not shown). Process gas is introduced into the space 100A inside the vacuum chamber 100 through the gas introduction pipe 116 and the distribution plate 12 and the gas blowoff plate 115 of the electrode 103. On the other hand, the process gas is evacuated to the outside by the evacuating mechanism 112. At this time, the internal pressure of the shield member 113 is controlled to a suitable pressure by the pressure control valve 111. In this state, the electric power is fed between the substrate holder 106 and the electrode 103 by the power sources 107 and 108 to cause the discharge at the space 14 in front of the substrate 118 and produce plasma. At this time, according to the plasma etching system of this embodiment, the plasma produced at the space 14 in front of the substrate 118 is controlled using the distribution and strength of the magnetic field resulting from the magnets 11 arranged as explained above. The material on the substrate 118 is etched using the plasma produced in the space 14, but the state of the plasma is controlled by the magnetic field based on the magnets 11, so it becomes possible to etch the material on the substrate 118 uniformly in a short time. Further, in this embodiment, the process gas introduced to the space 14 in front of the substrate 118 is uniformly blown off over the substrate 118 by the holes of the gas distribution plate 12, the intervals between the plurality of magnets, and the gas blow-off holes 115a of the gas blowoff plate 115, which are provided in the vacuum at the electrode 103.

When supplying the electric power between the electrode 103 and the substrate holder 106 from the power sources 107 and 108 in the state of introducing the process gas into the front space 14 of the substrate 118 in the vacuum chamber 100, a discharge is induced to generate plasma. When applying the electric power between the substrate holder 106 and the electrode 103 facing thereto and producing plasma at the internal space 100A, a plasma density and plasma distribution determined by the electric field are obtained. Due to this plasma density and plasma distribution, the etch rate and the etching distribution of the etched material on the substrate 118 are determined.

In the present embodiment, further, since the magnets 11 meeting the above conditions is used, the desired density and distribution of plasma produced can be obtained by the correlation of the electric field and magnetic field. Conversely, by applying the magnetic field distribution of the magnets 11 to a certain set electric field, it becomes possible to greatly improve the etch rate and etching distribution of the etched material on the substrate 118.

In the plasma etching system shown in FIG. 4, as another experiment, when using the above magnets 11 creating, for example, a 9 to 42 Gauss recessed magnetic field distribution at the plane 51 positioned at the center of the electrode 103 and the substrate holder 106, an extremely recessed distribution shape is exhibited and the average etch rate can be improved over 15 percent, as compared with the projecting shape of the etching distribution of the etched material when not using the magnets. By controlling the magnetic field distribution at the plane 51 by the magnets 11 in this way, it is possible to improve the distribution shape of the etched material.

Further, in the plasma etching system, the damage given to the substrate 118 is mentioned as a matter for concern, but since the magnets 11 are arranged right behind the gas blowoff plate 115, the distance between the substrate holder 106 and the electrode 103 is not made larger, it is possible to produce a strong magnetic field near the gas blowoff plate 115, possible to produce a uniform magnetic field substantially close to "0" on the surface of the substrate 118, and possible to reduce the damage inflicted on the surface of the substrate 118. Further, it becomes possible to move the plasma away from near the substrate 118 and a synergistic effect is produced relating to the reduction of the damage inflicted on the substrate 118.

Further, by arranging the magnets 11 in rings, it is possible to simplify the simulation, improve the speed of development of such plasma etching systems, and therefore provide timely systems to the end users. Further, by forming the magnets 11 divided in the circumferential direction, it becomes possible to handle problems by just locally replacing parts.

While the invention has been described by reference to specific embodiments chosen for purposes of illustration, it should be apparent that numerous modifications could be made thereto by those skilled in the art without departing from the basic concept and scope of the invention.

What is claimed is:

1. A plasma etching system comprising:
   a vacuum chamber,
   a substrate holder arranged within said vacuum chamber,
   an electrode arranged in said vacuum chamber so as to face said substrate holder, having a process gas introduction mechanism and a gas blowoff plate, and
   an electric power source for supplying electric power to said electrode,
      wherein a substrate is loaded on said substrate holder in said vacuum chamber in a vacuum state, the process gas is introduced into said vacuum chamber through said electrode, and said power source applies the electric power between said substrate holder and said electrode to generate plasma used for etching surface of said substrate, and
   a plurality of magnets arranged concentrically at a rear side of said gas blowoff plate in said electrode within said vacuum chamber,
      wherein magnetic poles of inner surfaces of said plurality of magnets are arranged to alternate in polarity and the magnetic field strength resulting from said plurality of magnets on the surface of said substrate is substantially 0 Gauss.

2. A plasma etching system as set forth in claim 1, wherein the magnetic field strength resulting from said plurality of magnets at a plane positioned substantially at the center between said substrate holder and said electrode is made a uniform 100 Gauss.

3. A plasma etching system as set forth in claim 1, wherein the magnetic field strength resulting from said plurality of magnets at a plane positioned substantially at the center between said substrate holder and said electrode is made a uniform 200 Gauss.

4. A plasma etching system as set forth in claim 1, wherein said plurality of magnets are fixed to a gas distribution plate and gas introduction holes are formed in said gas distribution plate corresponding to intervals between two of said plurality of magnets.

* * * * *